United States Patent [19]

Hayashi et al.

[11] Patent Number: 5,330,966
[45] Date of Patent: Jul. 19, 1994

[54] METHOD OF PREPARING 2223 PHASE (BI,PB)-SR-CA-CU-O SUPERCONDUCTING FILMS

[75] Inventors: Noriki Hayashi; Satoshi Takano, both of Osaka, Japan

[73] Assignees: Sumitomo Electric Industries, Inc.; The Kansai Electric Power Co., Inc., both of Osaka, Japan

[21] Appl. No.: 905,994

[22] Filed: Jun. 26, 1992

Related U.S. Application Data

[63] Continuation of Ser. No. 666,299, Mar. 8, 1991, abandoned.

[30] Foreign Application Priority Data

Mar. 8, 1990 [JP] Japan ................................. 2-57649
Mar. 8, 1990 [JP] Japan ................................. 2-57650

[51] Int. Cl.$^5$ ......................... B05D 5/12; C23C 16/00
[52] U.S. Cl. ................................. 505/473; 505/704; 505/730; 505/731; 505/732; 505/742; 505/734; 505/474; 505/475; 427/62; 427/419.2; 427/419.3; 427/596; 427/404; 427/255.3; 204/192.24
[58] Field of Search ............... 505/1, 731, 732, 730, 505/742, 734, 704; 427/62, 63, 255.3, 419.2, 419.3, 404, 596; 204/192.24

[56] References Cited

U.S. PATENT DOCUMENTS

5,051,398  9/1991  Higaki et al. ......................... 505/1

FOREIGN PATENT DOCUMENTS

0311337  4/1989  European Pat. Off. .

OTHER PUBLICATIONS

Kampwirth et al, "Properties of sputtered superconducting films of $Bi_2Sr_2CaCu_2O_x$ made by low-temperature in situ growth," Appl. Phys. Lett. 55(20) Nov. 1989, pp. 2135-2137.

Endo et al, "Preparation of As-deposited Bi-Sr-Ca-Cu-O films with high Tc superconducting phase by metalorganic chemical vapor deposition," Jpn. J. Appl. Phys. vol. 29, No. 2, Feb. 1990 pp. L294-L297.

A. Tanaka et al., "Pb-doped Bi-Sr-Ca-Cu-O Thin Films", 54 Applied Physic Letters 14, pp. 1362-1364 (Apr. 1989).

J. M. Zhang, et al., "Organometallic Chemical Vapor Deposition of Superconducting, High $T_c$ Pb-doped Bi-Sr-Ca-Cu-O Thin Films", 55 Applied Physics Letters 18, pp. 1906-1908 (Oct. 1989).

T. Yotsuya et al., "Fabrication of Bi(Pb)SrCaCuO Thin Film of High-Tc Phase", 28 Japanese Journal of Applied Physics 6, Part 2, pp. L972-L974 (Jun. 1989).

Takano et al, "Annealing in a PbO atmosphere for high Tc superconductivity of Bi-Sr-Ca-Cu-O films", Appl. Phys. Lett. 55(8) Aug. 1989, pp. 798-800.

Hayakawa et al, "Effects of Film Thickness and Annealing Conditions on 2223 Phase Growth in BSCCO Films Produced by Pb Vapor Doping", Jpn. J. Appl. Phys. 29(6)Jun. 1990 L943-946.

*Primary Examiner*—Roy V. King
*Attorney, Agent, or Firm*—Pennie & Edmonds

[57] ABSTRACT

An oxide superconducting layer is formed on a base material of silver, whose single side is coated with MgO, or single-crystalline MgO for depositing a $Bi_2Sr_2Ca_2Cu_3$ phase in a crystallographically oriented state by sputtering, CVD or laser ablation. Metal lead or lead oxide is then laid thereon by sputtering to obtain a two-layer structure, and the two-layer structure is heat treated in the atmospheric air. Thus, a bismuth oxide superconducting film, which is excellent in crystal orientation as well as denseness and thereby having high critical current density, is formed on the base material.

7 Claims, No Drawings

METHOD OF PREPARING 2223 PHASE (BI,PB)-SR-CA-CU-O SUPERCONDUCTING FILMS

This is a continuation of application Ser. No. 07/666,299, filed Mar. 8, 1991, now abandoned.

BACKGROUND OF THE INVENTION

1. Field of the Invention

The present invention relates to a method of preparing an oxide superconducting film, and more particularly, it relates to a method of preparing an oxide superconducting film which is formed on a base material by a vapor phase method.

2. Description of the Background Art

In order to enable application of an oxide superconductive material to a conductor, an oxide superconducting film may be formed on a base material. When such base materials are made of single-crystalline materials, for example, it is possible to obtain various elements, provided with oxide superconducting films, which are employed in the field of electronics. When a base material is made of a flexible long material, it is possible to obtain an oxide superconducting wire.

Among oxide superconductive materials, a BiSrCaCuO superconductive material is known by its high critical temperature of superconductivity.

In order to obtain a BiSrCaCuO superconductor by a solid phase method, lead or a compound of lead is added to a BiSrCaCuO superconductive material, which in turn is heat treated, thereby effectively improving the critical temperature of superconductivity.

On the other hand, in order to obtain a BiSrCaCuO superconductor by a vapor phase method, lead is added to a superconductive material. An oxide superconducting film having a high critical temperature is successfully prepared by:

(1) a method of adding lead during film formation and heat treating the material; or (2) a method of depositing a $Bi_2Sr_2Ca_1Cu_2$ phase, which has a critical temperature of 80K, in a crystallographically oriented state, thereafter laying lead on the same and heat treating the material, thereby converting the $Bi_2Sr_2Ca_1Cu_2$ phase to a $Bi_2Sr_2Ca_2Cu_3$ phase, which has a critical temperature of 110K (1989 Heisei Gannen Dai 36 Kai Oyo Butsurigaku Kainkei Rengo Koen-Kai Koen Yoko-Shu, 4p-F-2, "BPSCCO Thin Films with a Zero-Resistance Critical Temperature of 110K").

In the above method (1), c-axes of the Bi oxide superconductive material are perpendicularly oriented by heat treatment with respect to the base material. However, particles of the deposited film, which are grown along solid phase reaction, react at arbitrary growth rates in various sizes, whereby the film is significantly irregularized and deteriorated in smoothness and denseness. If an oxide superconductive material is thus deteriorated in denseness, it is impossible to improve critical current density.

In the method (2), on the other hand, improvement of critical current density is limited since grain growth occurs during conversion from the $Bi_2Sr_2Ca_1Cu_2$ phase to the $Bi_2Sr_2Ca_2Cu_3$ phase. A portion of unwanted film composition is caused by such change of phase such that a foreign phase is developed.

Further, in the method (2) metal lead is laid on the $Bi_2Sr_2Ca_1Cu_2$ phase. Such metal lead heterogeneously reacts when the same is heated to a temperature exceeding its melting point of 327.4° C., so as to cause heterogeneous crystal grain growth. This also limits improvement of critical current density.

Thus, when a BiSrCaCuO superconducting film is prepared by a vapor phase method, it is difficult to obtain an oxide superconducting film having high critical current density of superconductivity which film is also excellent in crystal orientation and denseness.

SUMMARY OF THE INVENTION

Accordingly, an object of the present invention is to provide a method of preparing an oxide superconducting film, which method can obtain an oxide superconducting film method having excellent crystal orientation and denseness as well as high critical current density. More particularly, an object of the present invention is to prepare a film of an oxide superconductive material such as a BiSrCaCuO superconductive material, for example, by a vapor phase method.

The present invention is directed to a method of preparing an oxide superconducting film, which comprises a step of forming an oxide superconducting layer on a base material by a vapor phase method. In order to solve the aforementioned technical problem, the inventive method comprises the steps of forming an oxide superconducting layer in a crystallographically oriented state, thereafter laying a material containing a lead element on the oxide superconducting layer to obtain a two-layer structure, and heat treating the two-layer structure.

When the present invention is applied to preparation of a BiSrCaCuO oxide superconducting film, the oxide superconducting layer, which is formed on the base material by a vapor phase method, is obtained by depositing a $Bi_2Sr_2Ca_2Cu_3$ phase in a crystallographically oriented state.

According to the present invention, lead metal or a compound of lead such as lead oxide is preferably employed as the material containing a lead element.

When the base material employed in the present invention is made of a single-crystalline material, it is possible to advantageously prepare an oxide superconducting film which is applicable to various elements employed in the field of electronics. MgO, $SrTiO_3$, ZrO, Si or the like may be employed as such a single-crystalline material.

When a long flexible base material is used, it is possible to advantageously prepare an oxide superconducting wire, which comprises such a base material and an oxide superconducting film provided thereon. Such a flexible base material can be made of ceramics of partially stabilized zirconia, stabilized zirconia, alumina, yttria, silica or titania, or a metal material of platinum, gold, silver, aluminum, nickel, nickel alloy, copper, copper alloy, aluminum alloy or stainless steel. Further, this long flexible base material is prepared in the form of a tape or fiber.

According to the present invention, a crystallographically oriented oxide superconducting layer is formed on a base material, and lead or a compound of lead such as lead oxide is laid thereon to obtain a two-layer structure, which in turn is heat treated. Thus, it is possible to prepare an oxide superconducting film having excellent crystal orientation and high critical current density after heat treatment.

The present invention is also characterized in that surface smoothness of the oxide superconducting film is not significantly changed. If a film having a smooth surface, i.e., a dense film, is formed when the oxide super-conducting layer is deposited on the base material, it is possible to maintain a relatively smooth state, i.e., a considerably dense state, after heat treatment. Thus, an oxide superconducting film having high critical current density can be readily prepared.

Thus, according to the present invention, it is possible to easily prepare an oxide superconducting film which has excellent crystal orientation and denseness as well as high critical current density. Particularly when the present invention is applied to preparation of a BiSrCaCuO oxide superconducting film, it is possible to effectuate maximum excellent properties of such an oxide superconductive material, which exhibits a critical temperature of 110K, thereby advantageously enabling application of such an oxide superconducting film to a conductor.

Further, according to the present invention, it is not necessary to particularly increase a film formation temperature in the step of laying lead or a compound of lead such as lead oxide, as the oxide superconducting film can be prepared through a simple apparatus in a short time.

DESCRIPTION OF THE PREFERRED EMBODIMENTS

Example 1

BiSrCaCuo oxide superconducting films were prepared through a sputtering device.

First, base materials of silver, coated with MgO, and single-crystalline MgO were employed to form oxide superconducting layers under the following film forming conditions:
Target: $Bi_3Sr_2Ca_2Cu_3O_x$
Target Diameter: 4 inches
Film Forming Temperature: 650° C.
RF Power: 75 W
Distance Between Target and Substrate: 50 mm
Gas Pressure: 10 mTorr
Gas Composition: $Ar/O_2 = 9/1$
Film Forming Time: one hour The as-formed BiSrCaCuO oxide superconducting layers were examined in this stage, whereby the following facts were proved regardless of the types of the base materials: The surfaces of the oxide superconducting layers, observed with an electron microscope, were so smooth that it was impossible to discriminate boundaries between deposited particles. As to crystal orientation examined with an X-ray diffractometer, it was confirmed that c-axes of $Bi_2Sr_2Ca_2Cu_3$ phases were perpendicularly oriented with respect to the base materials. Parts of the oxide superconducting layers were cut out, to confirm composition ratios of metal elements of $Bi_2Sr_2Ca_2Cu_3$.

Then, lead oxide and lead were deposited on the BiSrCaCuO oxide superconducting layers, which were prepared in the aforementioned manner, by sputtering under the following conditions:

(1) For Lead Oxide Layers:
Target: PbO
Target Diameter: 4 inches
Film Forming Temperature: no heating
RF Power: 100 W
Distance Between Target and Substrate: 50 mm
Gas Pressure: 10 mTorr
Gas Composition: A $r/O_2 = 9/1$
Film Forming Time: 5 minutes
(2) For Lead Layers:
Target: Pb
Target Diameter: 4 inches
Film Forming Temperature: no heating
RF Power: 100 W
Distance Between Target and Substrate: 50 mm
Gas Pressure: 10 mTorr
Gas Composition: $Ar/O_2 = 9/1$
Film Forming Time: one minute The as-formed two-layer films, which were provided with lead oxide layers under the conditions (1), were analyzed, to prove the following facts regardless of the types of the base materials: The surfaces of the films, observed with an electron microscope, were so smooth that it was impossible to discriminate boundaries between the particles. As to crystal orientation examined with an X-ray diffractometer, c-axes of $Bi_2Sr_2Ca_2Cu_3$ phases were perpendicularly oriented with respect to the base materials substantially identically to the above results attained before deposition of lead oxide, and no diffraction peaks were newly caused by such deposition of lead oxide. Parts of the films were cut out, to confirm composition ratios of metal elements of $Bi_2Pb_{0.5}Sr_2Ca_2Cu_3$.

The other films, which were provided with lead layers under the conditions (2), exhibited surface states, crystal orientation properties and composition ratios substantially identical to those of the above films provided with the lead oxide layers under the conditions (1).

The two-layer films thus provided with layers of lead oxide and lead respectively were heat treated under the following conditions:
Atmosphere: atmospheric air
Holding Temperature: 850° C.
Holding Time: one hour After the heat treatment, superconductive properties of the films were evaluated by a four-probe method. The results are as follows:

A. As to Base Materials of Silver:
(1) The film provided with the lead oxide layer exhibited a critical temperature of 108K, and critical current density of $98 \times 10^4$ A/cm$^2$ in liquid nitrogen.
(2) The film provided with the lead layer exhibited a critical temperature of 108K, and critical current density of $80 \times 10^4$ A/cm$^2$ in liquid nitrogen.

B. As to Base Materials of Single-Crystalline MgO:
(1) The film provided with the lead oxide layer exhibited a critical temperature of 108K, and critical current density of $156 \times 10^4$ A/cm$^2$ in liquid nitrogen.
(2) The film provided with the lead layer exhibited a critical temperature of 108K, and critical current density of $130 \times 10^4$ A/cm$^2$ in liquid nitrogen.

Example 2

BiSrCaCuO oxide superconducting films were prepared by a CVD process.

First, base materials of silver, whose single side was coated with MgO, and single-crystalline MgO were employed to form BiSrCaCuO oxide superconducting layers under the following film forming conditions:
Film Forming Temperature: 700° C.
Gas: $Bi(C_6H_5)_3$, $Sr(C_{11}H_{19}O_2)_2$, $Ca(C_{11}H_{19}O_2)_2$, $Cu(C_{11}H_{19}O_2)_2$
Carrier Gas: $Ar + O_2$
Gas Pressure: 10 Torr
Film Forming Time: one hour The as-formed oxide superconducting layers were examined in this stage, whereby the following facts were proved regardless of the types of the base materials: The surfaces of the oxide superconducting layers, observed with an electron microscope, were so smooth that it was impossible to discriminate boundaries between particles. As to crystal orientation examined with an X-ray diffractometer, c-axes of $Bi_2Sr_2Ca_2Cu_3$ phases were perpendicularly oriented with respect to the base materials. Parts of the oxide superconducting layers were cut out, to confirm composition ratios of metal elements of $Bi_2Sr_2Ca_2Cu_3$.

Then, lead oxide and lead were deposited on the BiSrCaCuO oxide superconducting layers, which were prepared in the aforementioned manner, by sputtering under the same conditions as Example 1.

The as-formed two-layer films, which were provided with lead oxide films, were analyzed, to prove the following facts regardless of the types of the base materials: The surfaces of these films, observed with an electron microscope, were so smooth that it was impossible to discriminate boundaries between the particles. As to crystal orientation examined with an X-ray diffractometer, c-axes of the $Bi_2Sr_2Ca_2Cu_3$ phases were perpendicularly oriented with respect to the base materials, substantially identically to the results attained before deposition of lead oxide, and no diffraction peaks were newly caused by such deposition of lead oxide. Parts of the films were cut out, to confirm composition ratios of metal elements of $Bi_2Pb_{0.5}Sr_2Ca_2Cu_3$.

The surface states, crystal orientation properties and composition ratios of the other two-layer films, which were provided with lead layers, were substantially identical to those of the above films provided with the lead oxide layers.

The two-layer films, which were provided with the layers of lead oxide and lead, were heat treated under conditions similar to those of Example 1.

After the heat treatment, superconductive properties of the films were evaluated by a four-probe method. The results are as follows:

A. As to Base Materials of Silver:
(1) The film provided with the lead oxide layer exhibited a critical temperature of 107K, and critical current density of $77 \times 10^4$ A/cm$^2$ in liquid nitrogen.
(2) The film provided with the lead layer exhibited a critical temperature of 107K, and critical current density of $64 \times 10^4$ A/cm$^2$ in liquid nitrogen.

B: As to Base Materials of Single-Crystalline MgO:
(1) The film provided with the lead oxide layer exhibited a critical temperature of 107K, and critical current density of $145 \times 10^4$ A/cm$^2$ in liquid nitrogen.
(2) The film provided with the lead layer exhibited a critical temperature of 107K, and critical current density of $118 \times 10^4$ A/cm$^2$ in liquid nitrogen.

Example 3

BiSrCaCuO oxide superconducting films were prepared by laser ablation.

First, base materials of silver, whose single side was coated with MgO, and single-crystalline MgO were employed to form BiSrCaCuO oxide superconducting layers under the following film forming conditions:
Laser Beam: ArF (193 nm)
Energy Density of Laser Beam: 1 J/cm$^2$
Frequency of Laser Beam: 10 Hz
Angle of Incidence of Laser Beam: 45°
Film Forming Temperature: 630° C.
Target: $Bi_2Sr_2Ca_2Cu_3O_x$.
Target Diameter: 50 mm
Gas: oxygen
Gas pressure: 100 mTorr
Distance Between Target and Substrate: 60 mm The as-formed BiSrCaCuO oxide superconducting layers were examined, whereby the following facts were proved regardless of the types of the base materials: The surfaces of the oxide superconducting layers, observed with an electron microscope, were so smooth that it was impossible to discriminate boundaries between particles. As to crystal orientation examined with an X-ray diffractometer, c-axes of $Bi_2Sr_2Ca_2Cu_3$ phases were perpendicularly oriented with respect to the base materials. Parts of the oxide superconducting layers were cut out, to confirm composition ratios of metal elements of $Bi_2Sr_2Ca_2Cu_3$.

Then, lead oxide and lead were deposited on the BiSrCaCuO superconducting layers, which were prepared in the aforementioned manner, by sputtering under the same conditions as Example 1.

The two-layer films which were provided with lead oxide layers were analyzed, to prove the following facts regardless of the types of the base materials: The surfaces of the films, observed with an electron microscope, were so smooth that it was impossible to discriminate boundaries between the particles. As to crystal orientation examined with an X-ray diffractometer, c-axes of the $Bi_2Sr_2Ca_2Cu_3$ phases were perpendicularly oriented with respect to the base materials substantially identically to the result attained before deposition of lead oxide, and no diffraction peaks were newly caused by such deposition of lead oxide. Parts of the films were cut out, to confirm composition ratios of metal elements of $Bi_2Pb_{0.5}Sr_2Ca_2Cu_3$.

The surface states, crystal orientation properties and composition ratios of the other two-layer films, which were provided with lead layers, were substantially identical to those of the above films provided with the lead oxide layers.

The two-layer films, which were provided with the lead oxide and lead layers, were heat treated under conditions similar to those of Example 1.

After the heat treatment, superconductive properties of the films were evaluated by a four-probe method. The results are as follows:

A. As to Base Materials of Silver:
(1) The film provided with the lead oxide layer exhibited a critical temperature of 106K, and critical current density of $94 \times 10^4$ current density of $94 \times 10^4$ A/cm$^2$ in liquid nitrogen.
(2) The film provided with the lead layer exhibited a critical temperature of 106K, and critical current density of $78 \times 10^4$ A/cm$^2$ in liquid nitrogen.

B: As to Base Materials of Single-Crystalline MgO:
(1) The film provided with the lead oxide layer exhibited a critical temperature of 106K, and critical current density of $176 \times 10^4$ A/cm$^2$ in liquid nitrogen.
(2) The film provided with the lead layer exhibited a critical temperature of 106K, and critical current density of $148 \times 10^4$ A/cm$^2$ in liquid nitrogen.

Reference Example 1

BiSrCaCuO oxide superconducting layers were deposited on base materials under the same conditions as Example 1. The surface states, crystal orientation properties and composition ratios of these oxide superconducting layers were substantially identical to those of Example 1.

These oxide superconducting layers were heat treated under the same conditions as Example 1, with no deposition of lead oxide or lead.

After the heat treatment, superconductive properties of the films were evaluated by a four-probe method.

As to critical current density in liquid nitrogen, the film comprising a base material of silver exhibited 800 A/cm$^2$ and that comprising a base material of single-crystalline MgO exhibited 5000 A/cm$^2$, while both films exhibited critical temperatures of 87K.

When similar films were evaluated with no heat treatment, the critical temperatures remained at 75K regardless of the types of the base materials.

Reference Example 2

BiSrCaCuO oxide superconducting layers were deposited on base materials under the same conditions as Example 2. The surface states, crystal orientation properties and composition ratios of these oxide superconducting layers were substantially identical to those of Example 2.

These oxide superconducting layers were heat treated under the same conditions as Example 1, with no deposition of lead oxide or lead.

After the heat treatment, superconductive properties of the films were evaluated by a four-probe method.

As to critical current density in liquid nitrogen, the film comprising a base material of silver exhibited 700 A/cm$^2$ and that comprising a base material of single-crystalline MgO exhibited 4000 A/cm$^2$, while both films exhibited critical temperatures of 88K.

When similar films were evaluated with no heat treatment, the critical temperatures remained at 74K regardless of the types of the base materials.

Reference Example 3

BiSrCaCuO oxide superconducting layers were deposited on base materials under the same conditions as Example 3. The surface states, crystal orientation properties and composition ratios of these oxide superconducting layers were substantially identical to those of Example 3.

These oxide superconducting layers were heat treated under the same conditions as Example 1, with no deposition of lead oxide or lead.

After the heat treatment, superconductive properties of the films were evaluated by a four-probe method.

As to critical current density in liquid nitrogen, the film comprising a base material of silver exhibited 800 A/cm$^2$ and that comprising a base material of single-crystalline MgO exhibited 6000 A/cm$^2$, while both films exhibited critical temperatures of 89K.

When similar films were evaluated with no heat treatment, the critical temperatures remained at 76K regardless of the types of the base materials.

Example 4

A BiSrCaCuO oxide superconducting film was prepared through a sputtering device.

First, a base material of silver coated with MgO was employed to form an oxide superconducting layer under the following film forming conditions:
Target: $Bi_3Sr_2Ca_1Cu_2O_x$
Film Forming Temperature: 620° C.
RF Power: 75 W
Gas Pressure: 10 mTorr
Gas Composition: $Ar/O_2=9/1$
Film Forming Time: one hour The as-formed BiSrCaCuO oxide superconducting layer was examined in this stage, to prove the following facts: The surface of the oxide superconducting layer, observed with an electron microscope, was so smooth that it was impossible to discriminate boundaries between deposited particles. As to crystal orientation examined with an X-ray diffractometer, c-axes of a $Bi_2Sr_2Ca_1Cu_2$ phase were perpendicularly oriented with respect to the base material. A part of the oxide superconducting layer was cut out, to confirm composition ratios of metal elements of $Bi_2Sr_2Ca_1Cu_2$.

Then, lead oxide was deposited on the BiSrCaCuO oxide superconducting layer, which was prepared in the aforementioned manner, by sputtering under the following conditions:
Target: PbO
Film Forming Temperature: no heating
RF Power: 100 W
Gas Pressure: 10 mTorr
Gas Composition: $Ar/O_2=9/1$
Film Forming Time: 5 minutes The two-layer film provided with a lead oxide layer was analyzed, to prove the following facts: The surface of the film, observed with an electron microscope, was so smooth that it was impossible to discriminate boundaries between the particles. As to crystal orientation examined with an X-ray diffractometer, c-axes of the $Bi_2Sr_2Ca_1Cu_2$ phase were perpendicularly oriented with respect to the base material substantially identically to the result attained before deposition of lead oxide, and no diffraction peak was newly caused by such deposition of lead oxide. A part of the film was cut out, to confirm composition ratios of metal elements of $Bi_2Pb_{0.5}Sr_2Ca_1Cu_2$.

The two-layer film thus provided with the lead oxide layer was heat treated under the following conditions:
Atmosphere: atmospheric air
Holding Temperature: 850° C.
Holding Time: one hour After the heat treatment, superconductive properties of the film were evaluated by a four-probe method. The film exhibited a critical temperature of 108K, and critical current density of $35 \times 10^4$ A/cm$^2$ in liquid nitrogen.

Example 5

A BiSrCaCuO oxide superconducting film was prepared by a CVD process.

First, a base material of silver whose single side was coated with MgO was employed to form a BiSrCaCuO oxide superconducting layer under the following film forming conditions:
Film Forming Temperature: 650° C.
Gas: $Bi(C_6H_5)_3$, $Sr(C_{11}H_{19}O_2)_2$, $Ca(C_{11}H_{19}O_2)_2$, $Cu(C_{11}H_{19}O_2)_2$
Carrier Gas: $Ar+O_2$
Gas Pressure: 10 Torr
Film Forming Time: one hour The as-formed oxide superconducting layer was examined in this stage, to prove the following facts: The surface of the oxide superconducting layer, observed with an electron microscope, was so smooth that it was impossible to discriminate boundaries between particles. As to crystal orientation examined with an X-ray diffractometer, c-axes of a $Bi_2Sr_2Ca_1Cu_2$ phase were perpendicularly oriented with respect to the base material. A part of the oxide superconducting layer was cut out, to confirm composition ratios of metal elements of $Bi_2Sr_2Ca_1Cu_2$.

Then, lead oxide was deposited on the BiSrCaCuO oxide superconducting layer prepared in the aforementioned manner, under the same conditions as Example 4.

The two-layer film which was provided with a lead oxide layer was analyzed, to prove the following facts: The surface of this film, observed with an electron microscope, was so smooth that it was impossible to discriminate boundaries between the particles. As to crystal orientation examined with an X-ray diffractometer, c-axes of the $Bi_2Sr_2Ca_1Cu_2$ phase were perpendicularly oriented with respect to the base material substantially identically to the result attained before deposition of lead oxide, and no diffraction peak was newly caused by such deposition of lead oxide. A part of this film was cut out, to confirm composition ratios of metal elements of $Bi_2Pb_{0.5}Sr_2Ca_1Cu_2$.

Then, the two-layer film provided with the lead oxide layer was heat treated under conditions similar to those of Example 4.

After the heat treatment, superconductive properties of this film were evaluated by a four-probe method. The film exhibited a critical temperature of 107K, and critical current density of $30 \times 10^4$ A/cm² in liquid nitrogen.

Example 6

A BiSrCaCuO oxide superconducting film was prepared by laser ablation.

A base material of silver whose single side was coated with MgO was employed to form a BiSrCaCuO oxide superconducting layer under the following film forming conditions:
Laser Beam: ArF (193 nm)
Energy Density of Laser Beam: 1 J/cm²
Frequency of Laser Beam; 10 Hz
Film Forming Temperature: 600° C.
Target: $Bi_2Sr_2Ca_1Cu_2O_x$
Gas: oxygen
Gas Pressure: 100 mTorr The as-formed BiSrCaCuO oxide superconducting layer was examined, to prove the following facts: The surface of the oxide superconducting layer, observed with an electron microscope, was so smooth that it was impossible to discriminate boundaries between particles. As to crystal orientation examined with an X-ray diffractometer, c-axes of a $Bi_2Sr_2Ca_1Cu_2$ phase were perpendicularly oriented with respect to the base material. A part of this oxide superconducting layer was cut out, to confirm composition ratios of metal elements of $Bi_2Sr_2Ca_1Cu_2$.

Then, lead oxide was deposited on the BiSrCaCuO superconducting layer which was prepared in the aforementioned manner, by sputtering under the same conditions as Example 4.

The two-layer film which was provided with a lead oxide layer was analyzed, to prove the following facts: The surface of this film, observed with an electron microscope, was so smooth that it was impossible to discriminate boundaries between the particles. As to crystal orientation examined with an X-ray diffractometer, c-axes of the $Bi_2Sr_2Ca_1Cu_2$ phase were perpendicularly oriented with respect to the base material substantially identically to the result attained before deposition of lead oxide, and no diffraction peak was newly caused by such deposition of lead oxide. A part of this film was cut out, to confirm composition ratios of metal elements of $Bi_2Pb_{0.5}Sr_2Ca_1Cu_2$.

Then, the two-layer film provided with the lead oxide layer was heat treated under conditions similar to those in Example 4.

After the heat treatment, superconductive properties of the film were evaluated by a four-probe method. The film exhibited a critical temperature of 106K, and critical current density of $40 \times 10^4$ A/cm².

Reference Example 4

A BiSrCaCuO oxide superconducting layer was deposited on a base material under the same conditions as Example 4. The surface state, crystal orientation and composition of this oxide superconducting layer were substantially identical to those of Example 4.

This oxide superconducting layer was heat treated under the same conditions as Example 4, with no deposition of lead oxide.

After the heat treatment, superconductive properties of the film were evaluated by a four-probe method. The film exhibited a critical temperature of 93K, and critical current density of 800 A/cm².

When a similar film was evaluated with no heat treatment, the critical temperature remained at 75K.

Reference Example 5

A BiSrCaCuO oxide superconducting layer was deposited under the same conditions as Example 5. The surface state, crystal orientation and composition of this oxide superconducting layer were substantially identical to those of Example 5.

The oxide superconducting layer was heat treated under the same conditions as Example 4, with no deposition of lead oxide.

After the heat treatment, superconductive properties of this film were evaluated. The film exhibited a critical temperature of 89K, and critical current density of 700 A/cm² in liquid nitrogen.

When a similar film was evaluated with no heat treatment, the critical temperature remained at 74K.

Reference Example 6

A BiSrCaCuO oxide superconducting layer was deposited under the same conditions as Example 6. The surface state, crystal orientation and composition of this oxide superconducting layer were substantially identical to those of Example 6.

Then, the oxide superconducting layer was heat treated under the same conditions as Example 4, with no deposition of lead oxide.

After the heat treatment, superconductive properties of this film were evaluated by a four-probe method. As the result, the film exhibited a critical temperature of 87K, and critical current density of 800 A/cm² in liquid nitrogen.

When a similar oxide superconducting film was evaluated with no heat treatment, the critical temperature remained at 76K.

What is claimed is:

1. A method of preparing a bismuth oxide superconducting film consisting essentially of a 2223 phase, comprising the steps of:
   forming a Bi-Sr-Ca-Cu oxide superconducting layer with atomic ratios of 2:2:2:3 of Bi:Sr:Ca:Cu on a base material in a crystallographically oriented state by a vapor phase method at a temperature of at least 600° C.;

laying a layer of a material containing lead on said oxide superconducting layer to obtain a two-layer structure; and heating treating said two-layer structure to obtain a $Bi_2Pb_{0.5}Sr_2Ca_2Cu_3$ oxide superconducting film.

2. A method of preparing an oxide superconducting film in accordance with claim 1, wherein said material containing lead is metal lead.

3. A method of preparing an oxide superconducting film in accordance with claim 1, wherein said material containing lead is a compound of lead.

4. A method of preparing an oxide superconducting film in accordance with claim 3, wherein said compound of lead is lead oxide.

5. A method of preparing an oxide superconducting film in accordance with claim 1, wherein said vapor phase method is selected from the group consisting of sputtering, CVD and laser ablation.

6. A method of preparing an oxide superconducting film in accordance with claim 1, wherein said step of laying a layer of material containing lead on said oxide superconducting layer is carried out by sputtering.

7. A method of preparing an oxide superconducting film in accordance with claim 1, wherein said base material is a long flexible material.

* * * * *